United States Patent [19]

Plais et al.

[11] Patent Number: 5,854,088
[45] Date of Patent: Dec. 29, 1998

[54] METHOD OF MANUFACTURING A SURFACE-EMITTING LASER

[75] Inventors: Antonina Plais, Paris; Paul Salet, Clamart; Joël Jacquet, Limours; Francis Poingt, Ste Genevieve des Bois; Estelle Derouin, Verrieres le Buisson, all of France

[73] Assignee: Alcatel Alsthom Compagnie Generale d'Electricite, Paris, France

[21] Appl. No.: 885,843

[22] Filed: Jun. 30, 1997

[30] Foreign Application Priority Data

Jul. 4, 1996 [FR] France .................................. 96 08338

[51] Int. Cl.⁶ .................................................. H01L 21/00
[52] U.S. Cl. ................................................ 438/39; 438/43
[58] Field of Search .................................. 438/39, 40, 42, 438/43; 372/45

[56] References Cited

U.S. PATENT DOCUMENTS

| 5,343,487 | 8/1994 | Scott et al. | 372/45 |
| 5,416,044 | 5/1995 | Chino et al. | |

OTHER PUBLICATIONS

P.D. Floyd et al, "Comparison of opticallosses in dielectric apertured vertical cavity lasers", *IEEE Photonics Technology Letters*, vol. 8, No. 5, May 1996, New York, US pp. 5990–592.

G. S. Li et al, "Polarisation & Modal Behaviour of Low Threshold Oxide and Airgap Confined Airgap Confined Vertical Cavity Lasers", *Electronics Letters*, vol. 31, No. 23, 9 Nov. 1995, pp. 2014/2015.

J. W. Scott et al, "High Efficiency Submilliamp Vertical Cavity Lasers with Intracavity Contacts", *IEEE Photonics Technology Letters*, vol. 6, No. 6, 1 Jun. 1994, pp. 678–600.

G. M. Yang et al, "Influence of Mirror Reflectivity on Laser Peformance of Very–Low–Threshold Vertical Cavity Surface– Emitting Lasers", *IEEE Photonics Technology Letters*, vol. 7, No. 11, 1 Nov. 1995, pp. 1228–1230.

G. M. Yang et al, "Ultralow Threshold Current Vertical–Cavity Surface–Emitting Lasers Obtained with Selective Oxidation", *Electronics Letters*, vol. 31, No. 11, 25 May 1995, pp. 886–888.

Patent Abstracts of Japan, vol. 95, No. 003 corresponding to JP 07 058408 A (Furukawa Electric Co., Ltd: The) 3 Mar. 1995.

*Primary Examiner*—Brian Dutton
*Attorney, Agent, or Firm*—Sughrue, Mion, Zinn, Macpeak & Seas, PLLC

[57] ABSTRACT

In a method of fabricating a surface-emitting laser, to assure good electrical confinement and good flatness of the mirrors defining the resonant cavity of the laser an electrical confinement layer is formed by carrying out the following steps:

forming an undercut layer, at least one growth step on the undercut layer, forming a mesa defining the shape and the location of the top mirror and exposing the undercut layer on its vertical walls, and controlled lateral etching of the undercut layer. Applications include the fabrication of a semiconductor laser on a III–V (e.g. InP or GaAs) substrate.

8 Claims, 4 Drawing Sheets

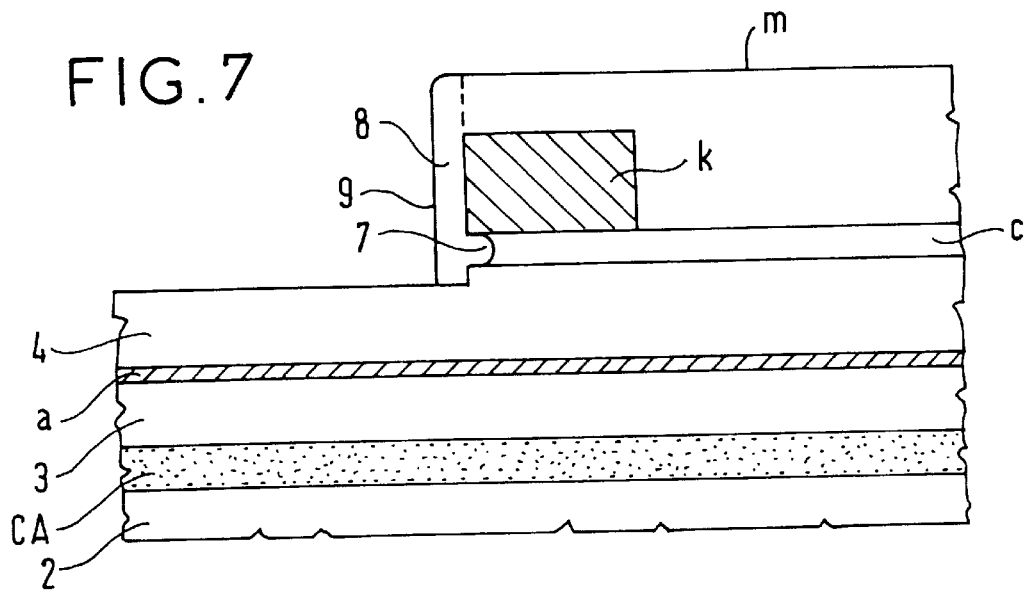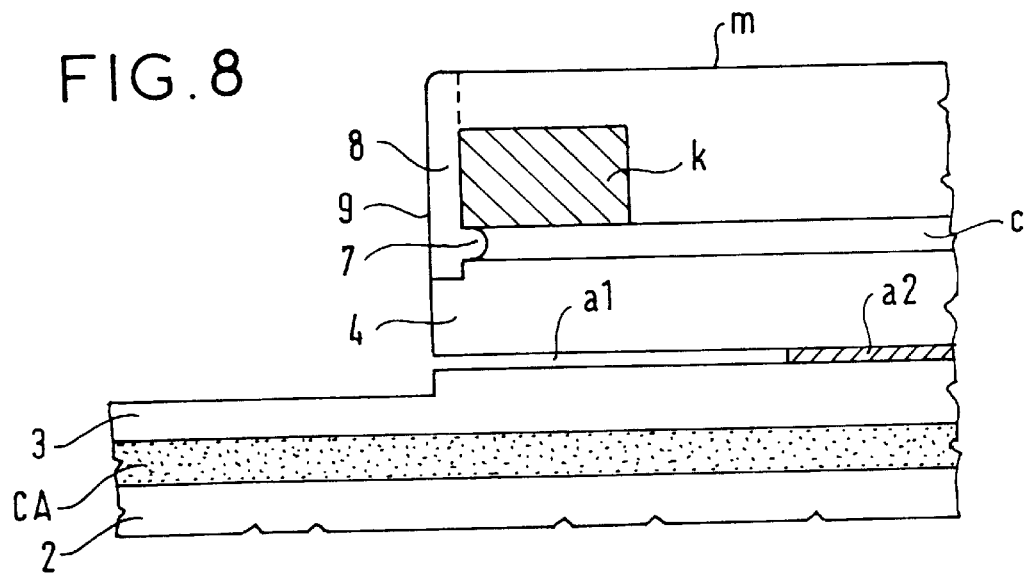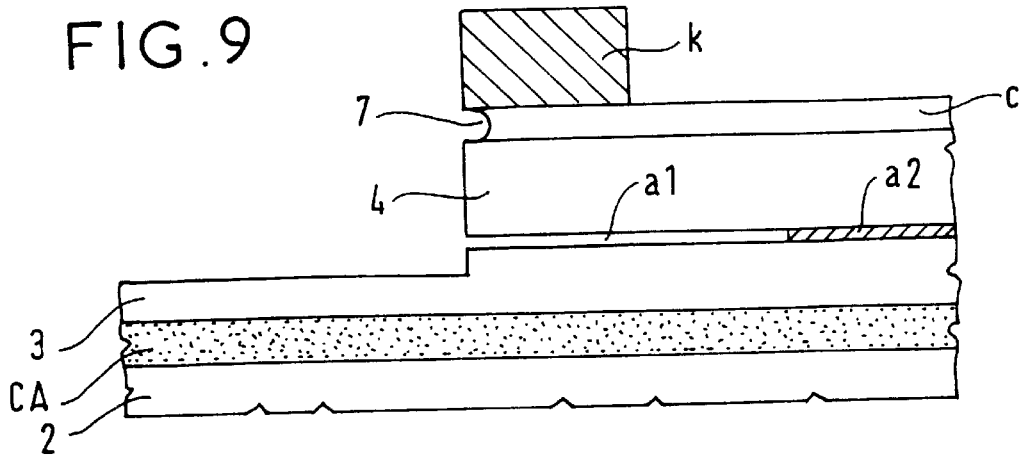

METHOD OF MANUFACTURING A SURFACE-EMITTING LASER

BACKGROUND OF THE INVENTION

1. Field of the Invention

The invention concerns vertical cavity surface-emitting lasers (VCSEL).

2. Description of the Prior Art

These lasers are implemented on a substrate of a III–V type semiconductor alloy such as gallium arsenide GaAs or indium phosphide InP.

Unlike conventional semiconductor lasers, in VCSEL the light is emitted perpendicularly to the surface of the active layer and in the same direction as that in which the electrical current sustaining the laser effect is injected. In the case of an InP substrate, the component is essentially a resonant cavity delimited by two opposed dielectric or semiconductor mirrors. The resonant cavity is formed of a p-doped InP layer, an undoped GaInAsP quaternary active layer and an n-doped InP layer. The current is injected by means of two electrodes disposed one on each side of the resonant cavity. If the mirror is made of a dielectric material at least one of the electrodes is necessarily placed alongside or more usually around that mirror.

The efficiency of a structure of this kind is dependent on sufficient optical and electrical confinement of the active layer. To this end, a structure can be chosen in which the active layer is buried in a medium having a lower refractive index. If the active layer is also buried in a p-doped medium at the boundary of the n medium, electrical confinement due to the threshold voltage of the p-n junction surrounding the active layer is also obtained.

To obtain high-power lasers emitting continuously and operating at room temperature it is necessary to reinforce the electrical confinement in order to improve efficiency and to reduce heating of the component. One solution to this problem is proposed in the article "Continuous Wave GaInAsP/InP Surface-Emitting Lasers with a Thermally Conductive MgO/Si Mirror", Toshihiko BABA et al, Japanese Journal of Applied Physics, Vol. 33 (1994), Part 1, N° 4A, Apr. 1994, pages 1905–1909.

This article proposes the provision of a blocking junction bearing on the buried active layer all around its perimeter. This solution does improve electrical confinement. Efficiency is not optimal, however. Measurements and simulations on a structure of this kind show that the current density in the active layer is not uniform. To be more precise, the current density is higher (in a ratio in the order of 4:1) at the periphery of the active layer than at its center. As a result the laser effect can be obtained only in an annular mode since the carrier density at the center is below that required to reach the laser threshold.

Another solution is described in the article "Ultralow threshold current vertical-cavity surfaceemitting lasers obtained with selective oxidation", G. M. Yang et al, ELECTRONICS LETTERS, 25 May 1995, Vol. 31, N° 11, pages 886–888. The proposed structure includes an active layer that is not buried and on top of which is placed a current confinement layer. This layer is a continuous layer of aluminum arsenide which is subjected to controlled lateral oxidation to leave a current opening under the top mirror. This solution assures good flatness of the surface receiving the mirror but requires delicate control of the lateral oxidation step. Moreover, it is then necessary to deposit a silicon nitride protective layer to prevent oxidation of the aluminum arsenide layer.

An aim of the invention is to avoid the disadvantages of the preceding solutions by proposing a method that is easy to implement and that can be used regardless of the composition of the substrate.

SUMMARY OF THE INVENTION

To be more precise, the invention consists in a method of fabricating a surface-emitting semiconductor laser component comprising a vertical resonant cavity formed on a substrate of III–V elements, said cavity containing an electrical current injection layer provided with a horizontal electrical confinement layer disposed between a horizontal active layer and a mirror defining said cavity, the formation of said current injection layer comprising the following steps:

growing on top of said active layer an undercut layer transparent at the intended operating wavelength of said component, at least one step of growing doped III–V elements on said undercut layer, forming a mesa centered relative to the intended location of said mirror and the lateral walls of which expose said undercut layer, and controlled lateral etching of said undercut layer to form said electrical confinement layer.

The confinement layer is therefore in the form of a diaphragm, the effect of which is to concentrate the lines of current passing through the active layer in a delimited area vertically aligned with the top mirror. The proposed method has the advantage of avoiding all problems with the flatness of the semiconductor layers between the diaphragm and the mirror. Moreover, the fact that the electrical confinement layer is made by lateral etching provides total electrical insulation all around the diaphragm.

In one preferred embodiment of the invention this is greatly facilitated by having the natural walls of the mesa in the form of four vertical planes oriented at approximately 45° to the cleavage planes of the substrate.

Unlike the other crystal planes of III–V alloys, those oriented at 45° to the cleavage planes have identical etching properties. As a result the undercut layer is etched faster and its depth is the same in all four directions, which results in increased precision as to the shape and the dimensions of the confinement diagram.

In one particular embodiment the lateral walls of the mesa have the same dimensions, which enhances the precision of the etching.

A contact layer below the mirror and providing an interface with the electrode surrounding the mirror is generally provided in surface-emitting lasers. Given the types of substrate used and allowing for the required optical and electrical properties, the composition of this contact layer often has etching properties similar to those of the undercut layer. In this case, and to avoid having to form the contact layer after the confinement layer, the process of forming the mesa advantageously comprises:

a first etching step that does not etch said undercut layer but exposes said contact layer, depositing onto said contact layer a protection layer having etching properties different than those of said undercut layer, and at least one second etching step to expose said undercut layer.

In accordance with a supplementary aspect of the invention, the deposition of the protection layer is preceded by light lateral etching of the contact layer. This improves the fixing of the protection layer to the vertical walls of the mesa.

Other aspects and advantages of the invention will emerge from the remainder of the description, which is given with reference to the drawings.

BRIEF DESCRIPTION OF THE DRAWINGS

FIGS. 1 through 9 show the principal steps of fabrication of the laser of the invention.

DETAILED DESCRIPTION OF THE PREFERRED EMBODIMENT

The fabrication steps to be described are given for the particular case of an InP substrate. The method can be applied to any other substrate of III–V elements such as gallium arsenide GaAs, however.

Figure 1:
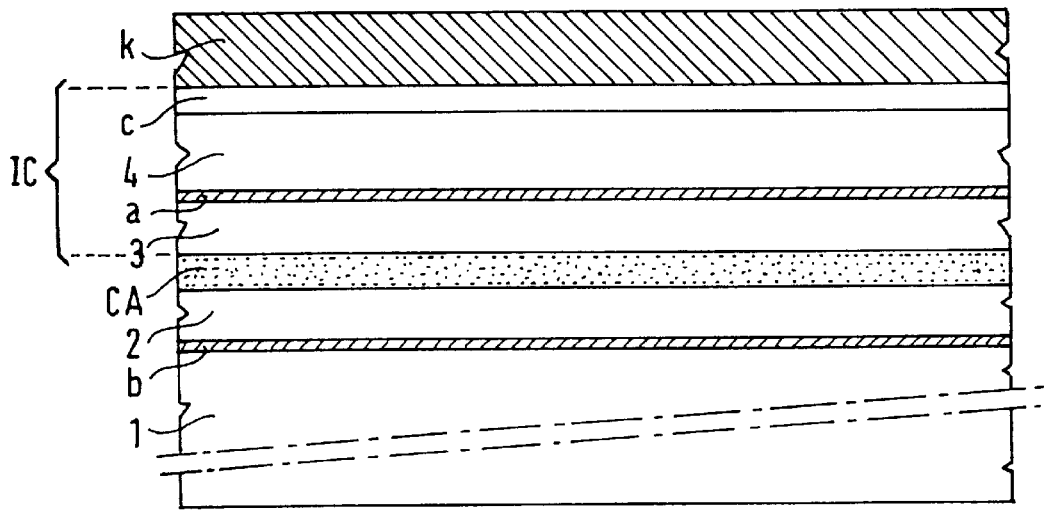

As shown in FIG. 1, there are deposited successively onto a n-doped indium phosphide substrate 1 an etch-stop layer b, a layer 2 with the same composition as the substrate, an active layer CA of an undoped InGaAsP quaternary alloy the composition of which defines the characteristic wavelength of the active layer, a p-doped indium phosphide layer 3, an undercut layer a, a p-doped indium phosphide layer 4, a contact layer c of a strongly p-doped InGaAs quaternary alloy or InGaAsP quaternary alloy, and, finally, a metallic layer k made up of an alloy of gold and platinum, for example.

The layers 3, a, 4, c constitute a current injection layer IC designed to conduct the electrical current from the top electrode surrounding a corresponding mirror.

The undercut layer a is an InGaAsP quaternary alloy the composition of which assures a characteristic wavelength shorter than that of the active layer CA. A composition is also chosen that confers upon this layer etch properties different than those of the neighboring layers 3 and 4.

Figure 2:
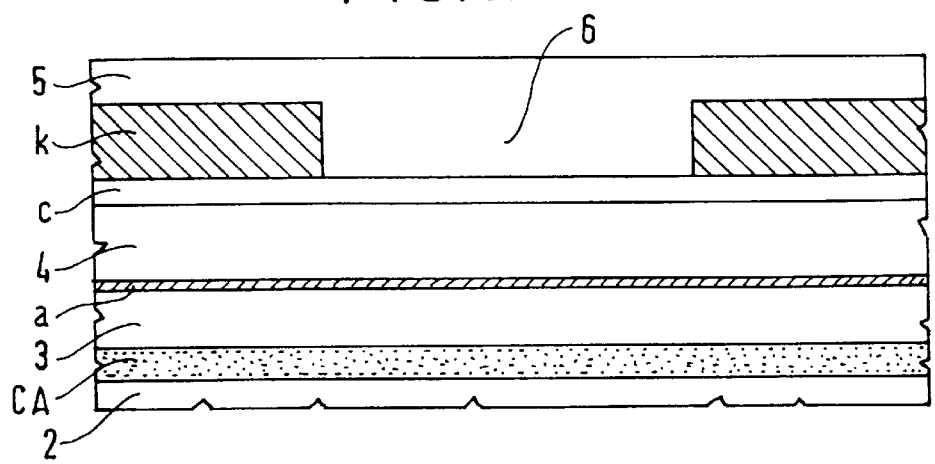

As shown in FIG. 2, the metallic layer k is then etched to form an opening 6 defining the location and the shape of the top mirror. All of the component is then covered by a protection layer 5. The layer 5 is silica $SiO_2$ or silicon nitride $Si_3N_4$, for example.

Figure 3:
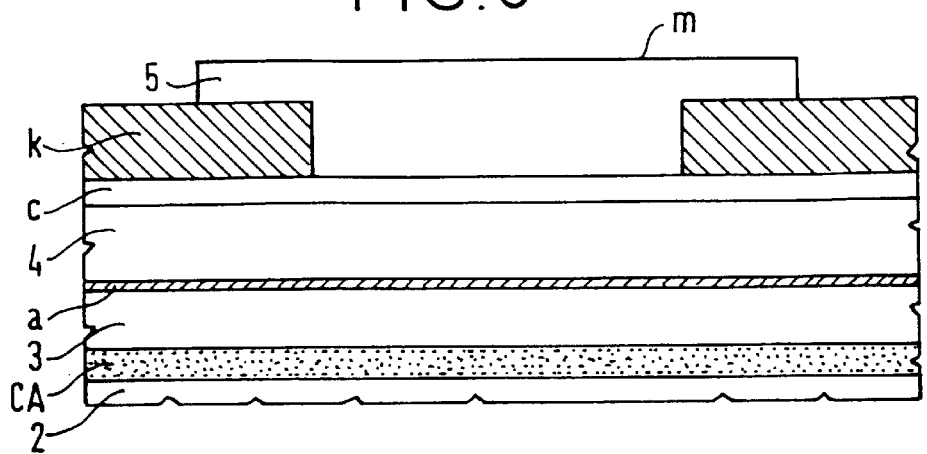
Figure 4:
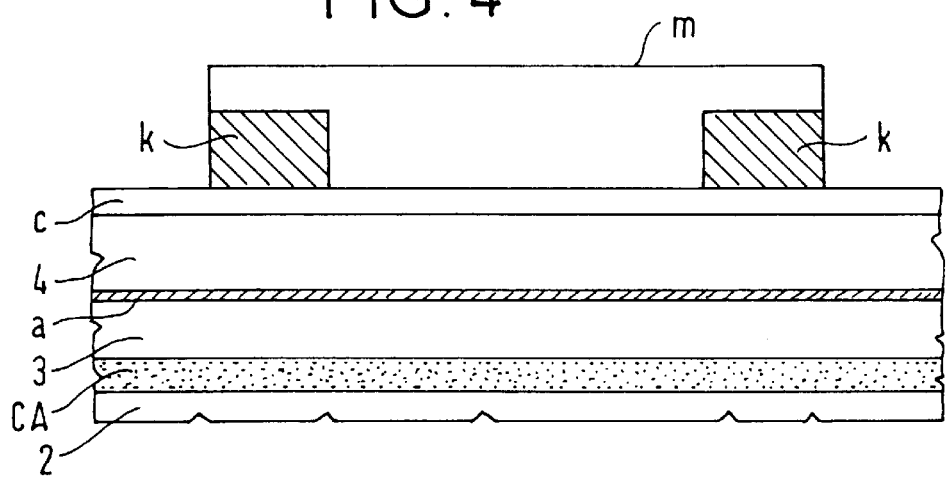

As shown in FIG. 3, the layer 5 is etched, for example by reactive ion etching (RIE), through a resin mask to commence the formation of a mesa m. Ionic machining of the metal layer k increases the height of the mesa as far as the contact layer c. The result is shown in FIG. 4.

Figure 5:
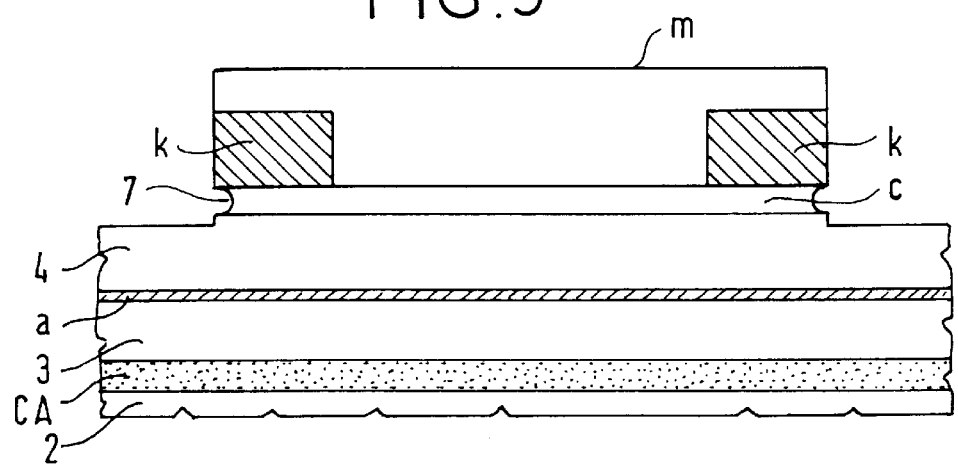

After removing the resin mask, the contact layer c and part of the layer 4 are etched by RIE to expose the sides of the layer c. Light undercutting of the contact layer c by wet etching is then carried out to form an anchor area 7 (see FIG. 5).

Figure 6:
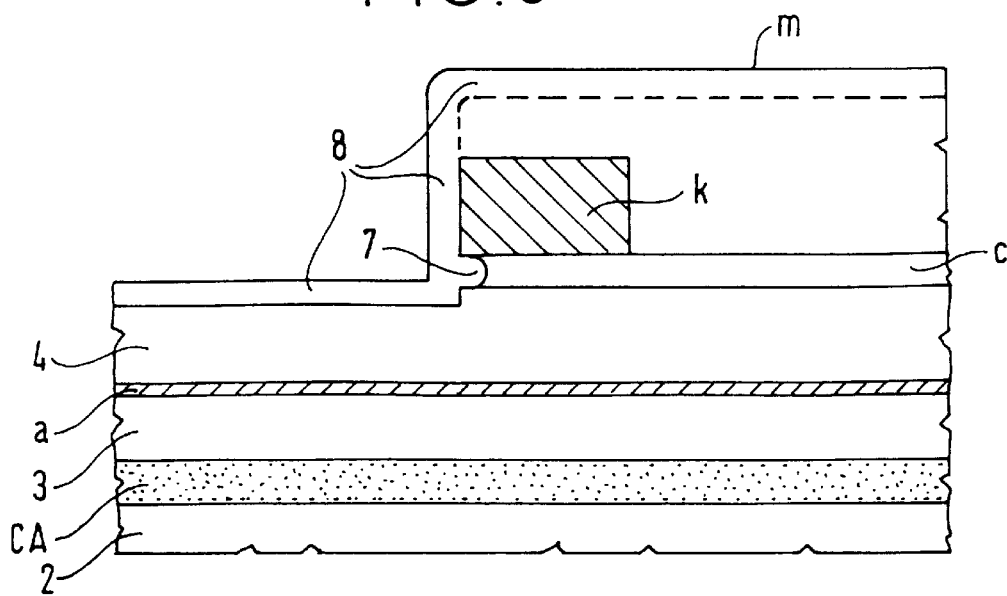

As shown in FIG. 6, the wafer is covered with a new protection layer 8 formed by an isotropic deposit of a protection material such as silica. This can be deposited by the plasma enhanced chemical vapor deposition (PECVD) process.

As shown in FIG. 7, the protection material is then etched anisotropically to eliminate the layer 8 from the horizontal surfaces of the wafer without removing it from the vertical walls 9 of the mesa m. The reactive ion etching (RIE) process is used, for example.

Non-selective RIE of the wafer using the silica covering mesa m as a mask then exposes the lateral extremities of the undercut layer a vertically aligned with the vertical walls 9. The effect of the anchor area 7 is to strengthen the adhesion of the silica layer 8 covering the wall 9. Controlled selective etching of the undercut layer then forms the current confinement layer consisting of a diaphragm a2 and its etched periphery a1, as shown in FIG. 8. This controlled etching can be wet etching using a $3H_2SO_4/H_2O_2/H_2O$ solution.

The silica remaining on the mesa is then eliminated (FIG. 9).

Figure 10:
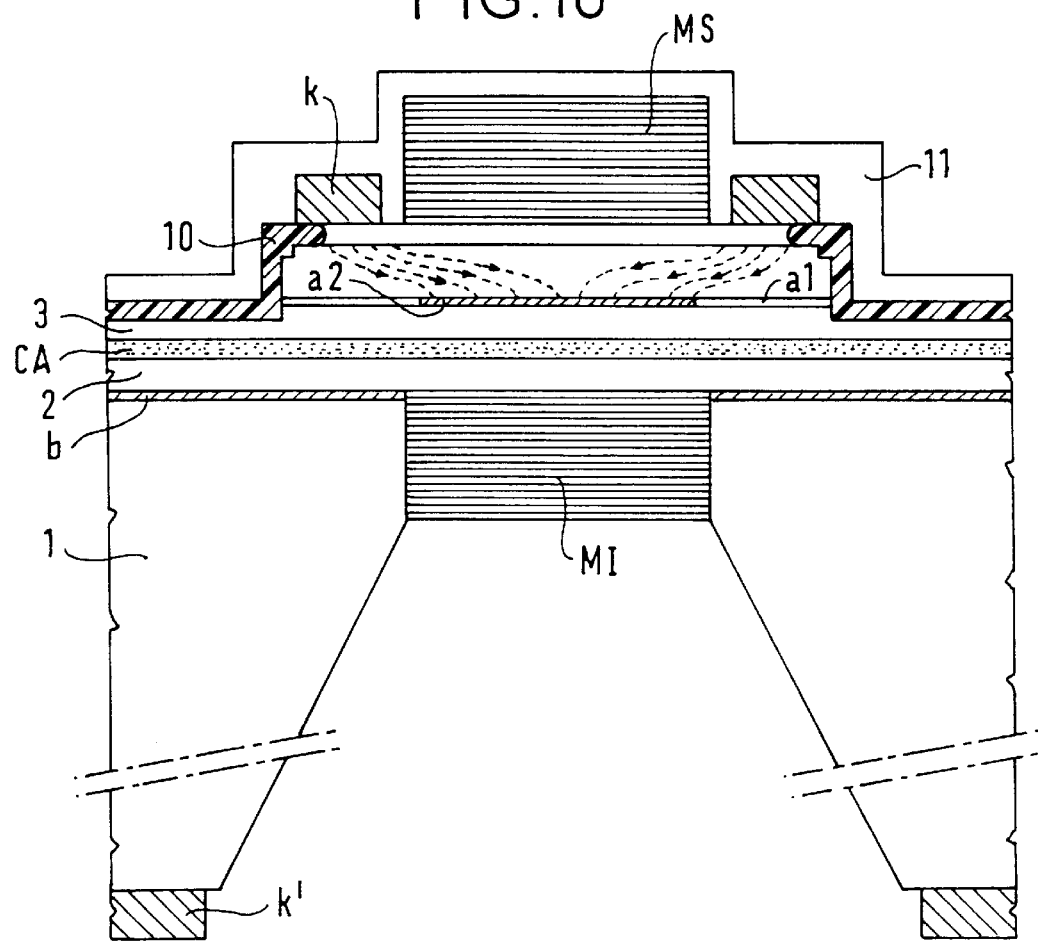
FIG. 10 is a cross-sectional view of the laser obtained by the method of the invention.

The final form of the component is shown in cross-section in FIG. 10. It is obtained after depositing a passivating layer 10 of silicon nitride, for example, acting as an electrical insulator. The top mirror MS is then deposited and the whole covered with a conductive coating 11 in the form of a thin (0.2 $\mu$m) layer of gold, for example, onto which a solder diffusion barrier consisting of a mixture of titanium, tungsten and gold is deposited. To complete the fabrication process the bottom part of the substrate is then etched down to the etch stop layer b, the bottom mirror MI is formed and the bottom electrode k' is added.

Figure 11:
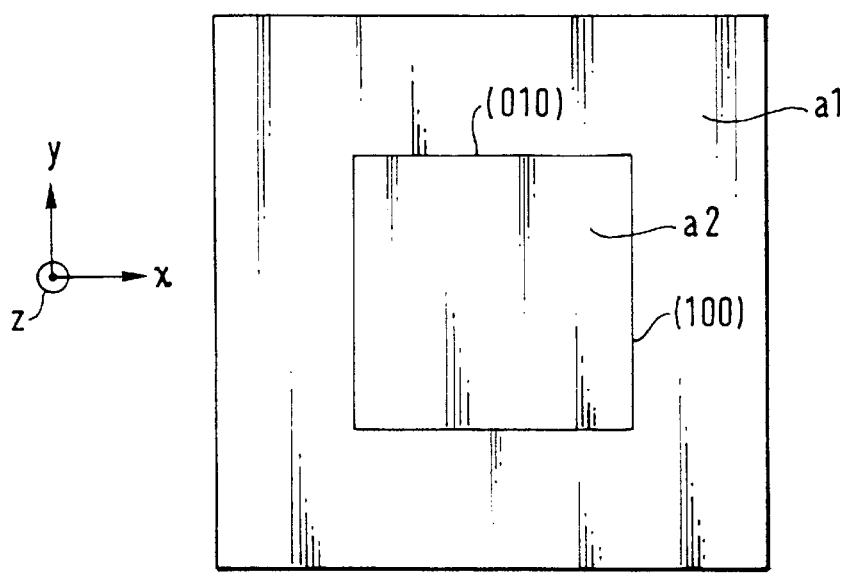
FIG. 11 is a top view showing the shape of the confinement layer.

As previously indicated, the choice of the orientation planes of the vertical walls of the mesa m is important in respect of the etching of the undercut layer a. FIG. 11 shows a top view of the confinement layer in relation to the crystal planes of the substrate. In accordance with one of the standard conventions, the horizontal face of the substrate is oriented in the (001) crystal plane. Orienting the vertical walls of the mesa in the (100) and (010) directions therefore defines planes oriented at 45° to the cleavage planes of the substrate and these planes have identical etching properties.

The confinement layer shown is a square diaphragm a2 surrounded by the undercut part a1 which is also delimited by a square. To obtain this structure it is sufficient for the resin mask defining the mesa (FIG. 3) also to be square. This implies that the vertical walls of the mesa are identical. The following dimensional data is given by way of illustration only:

thickness of active layer CA: 0.7 $\mu$m
thickness of undercut layer a: 0.1 $\mu$m
thickness of etch stop layer b: 0.1 $\mu$m
thickness of contact layer c: 0.2 $\mu$m
thickness of current injection layer CI: 3 $\mu$m
thickness of metallic layer k: 0.2 $\mu$m
width of mesa m: 12 $\mu$m–20 $\mu$m
width of opening area 6: 6 $\mu$m–10 $\mu$m
characteristic wavelength of active layer: 1.3 $\mu$m or 1.5 $\mu$m
characteristic wavelength of undercut layer a: 1.18 $\mu$m Of course, the invention is not limited to the single embodiment that has just been described. In particular, the metallic layer k can be deposited towards the end of the process by using a so-called "lift" technique to uncover the mirror area facing the diaphragm.

There is claimed:

1. A method of fabricating a surface-emitting semiconductor laser component having an operating wavelength and comprising a vertical resonant cavity formed on a substrate of III–V elements, said cavity containing an electrical current injection layer provided with a horizontal electrical confinement layer disposed between a horizontal active layer and a mirror defining said cavity, the formation of said current injection layer comprising the following steps:

growing over said active layer an undercut layer transparent at the operating wavelength of said component, at least one step of growing doped III–V elements on said undercut layer, forming a mesa centered relative to a location for said mirror such that lateral walls of said mesa are located over said undercut layer, and laterally etching said undercut layer to form said electrical confinement layer.

2. The method claimed in claim 1 wherein said lateral walls of said mesa are in the form of four vertical planes oriented at approximately 45° to cleavage planes of said substrate.

3. The method claimed in claim 2 wherein said lateral walls have the same dimensions as one another.

4. The method claimed in claim 1, wherein said current injection layer includes a contact layer which has etching properties similar to those of said undercut layer, said contact layer being placed over said undercut layer, and said step of forming said mesa comprises:

a first etching step that does not etch said undercut layer but exposes said contact layer, depositing onto said contact layer a protection layer having etching properties different than those of said undercut layer, and at least one second etching step to expose said undercut layer.

5. The method claimed in claim 4 wherein said step of depositing said protection layer is preceded by lateral etching of said contact layer.

6. The method claimed in claim 4 wherein said step of depositing said protection layer includes isotropic deposition of a protection material layer over the entire surface of said component followed by anisotropic etching to eliminate said protection material layer from horizontal faces of said component.

7. The method claimed in claim 4 wherein said protection layer is silica.

8. The method claimed in claim 1 wherein said substrate is indium phosphide and said undercut layer is a quaternary compound of phosphorus, indium, gallium and arsenic.

* * * * *